(12) United States Patent
Lian et al.

(10) Patent No.: US 10,690,711 B2
(45) Date of Patent: Jun. 23, 2020

(54) ELECTROSTATIC TEST DEVICE FOR DISPLAY MODULE

(71) Applicants: BOE Technology Group Co., Ltd., Beijing (CN); Ordos Yuansheng Optoelectronics Co., Ltd., Inner Mongolia (CN)

(72) Inventors: Long Lian, Beijing (CN); Tianlei Shi, Beijing (CN); Wulijibaier Tang, Beijing (CN); Zhongping Zhao, Beijing (CN); Ruijun Hao, Beijing (CN); Xiaojie Wang, Beijing (CN); Le Sun, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 90 days.

(21) Appl. No.: 16/111,886

(22) Filed: Aug. 24, 2018

(65) Prior Publication Data

US 2019/0235004 A1 Aug. 1, 2019

(30) Foreign Application Priority Data

Jan. 30, 2018 (CN) .......................... 2018 1 0092507

(51) Int. Cl.
*G01R 29/12* (2006.01)
*G09G 3/00* (2006.01)

(52) U.S. Cl.
CPC ............. *G01R 29/12* (2013.01); *G09G 3/006* (2013.01)

(58) Field of Classification Search
CPC ...................................................... G01R 29/12
See application file for complete search history.

(56) References Cited

U.S. PATENT DOCUMENTS

| 5,755,919 A * | 5/1998 | Ueda ....................... B32B 38/14 |
| | | 156/249 |
| 8,006,402 B2 | 8/2011 | Yoshizumi et al. |
| 2009/0299692 A1 | 12/2009 | Yoshizumi et al. |
| 2013/0133839 A1* | 5/2013 | Seo ....................... B32B 43/006 |
| | | 156/715 |

FOREIGN PATENT DOCUMENTS

| CN | 101598535 A | 12/2009 |
| CN | 101629871 A | 1/2010 |
| CN | 203191662 U | 9/2013 |
| CN | 203465485 U | 3/2014 |

(Continued)

OTHER PUBLICATIONS

First Office Action, including Search Report, for Chinese Patent Application No. 201810092507.2, dated Nov. 4, 2019, 15 pages.

*Primary Examiner* — Noam Reisner
(74) *Attorney, Agent, or Firm* — Westman, Champlin & Koehler, P.A.

(57) ABSTRACT

An electrostatic test device for a display module includes: a fixing frame; an electrostatic test probe on the fixing frame; a film-stripping mechanism on the fixing frame, the film-stripping mechanism being configured to strip off a protective film on the display module; and a drive assembly configured to drive the electrostatic test probe and/or the film-stripping mechanism to move.

15 Claims, 7 Drawing Sheets

(56) References Cited

FOREIGN PATENT DOCUMENTS

| | | | |
|---|---|---|---|
| CN | 103839864 A | 6/2014 | |
| CN | 203983415 U | 12/2014 | |
| CN | 104843258 A | 8/2015 | |
| CN | 109239431 A | 1/2019 | |
| JP | 2008-51906 A | 3/2008 | |
| JP | 2008051906 A * | 3/2008 | ............... G02B 5/30 |

* cited by examiner

ELECTROSTATIC TEST DEVICE FOR DISPLAY MODULE

CROSS-REFERENCE TO RELATED APPLICATION

This application claims the priority benefit of Chinese Patent Application No. 201810092507.2 filed on Jan. 30, 2018 in the State Intellectual Property Office of China, the disclosure of which is incorporated herein by reference in entirety.

BACKGROUND

Technical Field

Embodiments of the present disclosure relate to the field of display technology, and in particular, to an electrostatic test device for a display module.

Description of the Related Art

With the development of technology, display modules of mobile products have more and more strict requirement on static electricity. In order to cope with this requirement, electrostatic tests for film-stripping treatment of display modules are more and more common.

The conventional electrostatic test for film-stripping treatment is substantially manually done (i.e., a film is stripped manually). Film-stripping speed of the manual film stripping cannot be controlled. It is impossible to maintain a constant or specific film-stripping speed, which results in inability to perform film verification (static electricity is different at different film-stripping speeds). Moreover, a distance between an electrostatic test device and an object to be tested is difficult to be controlled. It is difficult to ensure a distance between a test probe and the object to be tested during the entire testing process, resulting in low reliability of the test result. In addition, the display module and a surface of a protective film are tested respectively, resulting in poor test efficiency. After the film is peeled off/stripped off, it is necessary to use the test probe to draw lines on a surface of the module and the surface of the protective film respectively, thereby the test for a single sheet takes a long time and has low efficiency.

SUMMARY

The embodiments of the present disclosure provide an electrostatic test device for a display module.

According to an aspect of the present disclosure, there is provided an electrostatic test device for a display module, comprising:
a fixing frame;
an electrostatic test probe on the fixing frame;
a film-stripping mechanism on the fixing frame, the film-stripping mechanism being configured to strip off a protective film on the display module; and
a drive assembly configured to drive the electrostatic test probe and/or the film-stripping mechanism to move.

In one embodiment, the drive assembly comprises:
a first driver configured to drive the fixing frame to move in a first direction; and
a second driver configured to drive the fixing frame to move in a second direction perpendicular to the first direction.

In one embodiment, the first driver comprises at least one first lead screw, and/or the second driver comprises at least one second lead screw.

In one embodiment, the electrostatic test probe comprises:
a first electrostatic test probe configured to test static electricity of a surface of the display module; and
a second electrostatic test probe configured to test static electricity of a surface of the protective film.

In one embodiment, the fixing frame comprises a probe holder, and the probe holder comprises a main frame, a through hole allowing the second lead screw to pass therethrough, and at least one adjustment groove extending downward from the main frame of the probe holder.

In one embodiment, the probe holder comprises at least two adjustment grooves separated from each other in the first direction, the first electrostatic test probe and the second electrostatic test probe each are disposed in one adjustment groove in an adjustable manner, and the second electrostatic test probe is disposed in front of the first electrostatic test probe in a moving direction of the film-stripping mechanism.

In one embodiment, the film-stripping mechanism comprises a roller disposed at a lower end of the fixing frame.

In one embodiment, the fixing frame comprises two roller holders, each of which is provided with through holes cooperating with the first lead screw and the second lead screw, and
wherein the two roller holders are also provided with pivoting members pivotally connecting the rollers.

In one embodiment, a compression spring is provided in each of the roller holders so that the roller is extendable towards the fixing frame or retractable away from the fixing frame.

In one embodiment, the drive assembly further comprises a third driver configured to drive the fixing frame to move in a third direction perpendicular to the first direction and the second direction, and the third driver comprises at least one third lead screw.

In one embodiment, the electrostatic test device comprises two first lead screws, two second lead screws, and four third lead screws.

In one embodiment, the fixing frame comprises a probe holder, and the probe holder comprises a main frame, through holes allowing the second lead screws to pass therethrough, and at least one adjustment groove extending downward from the main frame of the probe holder;
the fixing frame comprises two roller holders, each of which is provided with through holes cooperating with the first lead screws and the second lead screws respectively;
the two first lead screws are configured to respectively pass through the through holes in the roller holder and respectively connected to each of the third lead screws at two ends of the first lead screws via support members; and
the two second lead screws are configured to pass through the through holes of the roller holders and the probe holder respectively.

In one embodiment, the electrostatic test device further comprises a base on which at least two support plates extending in the third direction are provided, each of the support plates being fixedly connected to at least one of the third lead screws.

In one embodiment, a first directional positioning block and a second directional positioning block configured to position the display module are provided on the base.

In one embodiment, the base is provided with an air suction hole, and an adsorption force generated by the air suction hole fixes the display module on the base in position.

In one embodiment, the electrostatic test device further comprises a charge coupling device disposed on the fixing frame, the charge coupling device being configured to move the film-stripping mechanism to an initial film-stripping position according to the first directional positioning block and the second directional positioning block.

In one embodiment, a surface of the roller is provided with an antistatic material.

In one embodiment, a surface of the roller is provided with a viscous material.

BRIEF DESCRIPTION OF THE DRAWINGS

In order to more clearly illustrate technical solutions in embodiments of the present disclosure, the drawings in the embodiments will be briefly described below, and it should be understood that the drawings described below only refer to some embodiments of the present disclosure, rather than limiting the present disclosure. In the drawings.

DETAILED DESCRIPTION OF EMBODIMENTS

In order to more clearly set forth the objectives, technical solutions and advantages of the present disclosure, the embodiments of the present disclosure will be described in detail below with reference to the accompanying drawings. It should be understood that the following description of the embodiments is intended to explain and describe the general inventive concept of the present disclosure. In the specification and the drawings, the same or similar reference numerals are used to refer to the same or similar components or members. For the sake of clarity, the drawings are not necessarily drawn to scale, and some of known components and structures may be omitted in the drawings.

Unless otherwise defined, technical terms or scientific terms used in the embodiments of the present disclosure should be understood in terms of ordinary meaning by those skilled in the art. The terms "first", "second" and the like used in the embodiments of the present disclosure do not denote any order, quantity, or importance, but they are merely used to distinguish different components. The word "a" or "an" does not exclude a plurality of items. The word "include", "comprise", or the like is intended to mean that the elements or items that are present in front of such words cover the elements or items and equivalents thereof listed behind such words, without excluding other elements or items. The word "connect" or "join" and the like is not limited to physical or mechanical connections, but may include electrical connections, whether direct or indirect.

"Upper", "lower", "left", "right", "top", "bottom", and the like are only used to indicate relative positional relationships, and when an absolute position of the described object is changed, these relative positional relationships may also change accordingly. When an element such as a layer, a film, a region or a substrate is referred to as being "above" or "below" another element, the element may be "directly" "above" or "below" the another element, or there may be intermediate elements therebetween.

It should be understood that, in the embodiments of the present disclosure, the used terms "X-axis lead screw", "Y-axis lead screw", "Z-axis lead screw", "X-axis direction", "Y-axis direction", "Z-axis direction" and any other terms related to X-axis, Y-axis, and Z-axis are intended to mean mutual positional relationship between them, rather than being necessarily placed on the X-axis, the Y-axis, or the Z-axis. Such limitations are only for convenience of description.

In accordance with the general inventive concept of the embodiments of the present disclosure, an electrostatic test device for a display module is provided. The electrostatic test device includes a fixing frame, an electrostatic test probe, a roller (film-stripping mechanism), and a first driver such as an X-axis lead screw. Specifically, the electrostatic test probe is disposed on the fixing frame, the roller is disposed at a lower end of the fixing frame and configured to strip off/peel off a protective film on the display module, and the first driver is configured to drive the fixing frame and the like to move in a first direction (for example an X-axis direction). Further, the electrostatic test device may further include a second driver such as a Y-axis lead screw and/or a third driver such as a Z-axis lead screw, to drive the components such as the fixing frame and the roller to move in a second direction (Y-axis direction) and/or in a third direction (Z-axis direction). The movement of the components such as the fixing frame and the roller in the electrostatic test device may be automatically controlled by a controller such as a programmable logic controller.

It should be noted that, the first driver, the second driver and the third driver in the present disclosure may be respectively described as the X-axis lead screw (or first lead screw), the Y-axis lead screw (or second lead screw) and the Z-axis lead screw (or second lead screw) in a specific embodiment, but the present disclosure is not limited thereto, and they only refer to one specific embodiment given herein. It will be understood by those skilled in the art that the same or similar functions as the X-axis lead screw, the Y-axis lead screw and the Z-axis lead screw may be realized by other known driving means, that is to say, any suitable driving means that can allow the movements in the X-axis, Y-axis and Z-axis directions may be selected as the first driver, the second driver, and the third driver.

It is apparent that the electrostatic test device provided by the embodiments of the present disclosure can realize automatic movement of the components such as the fixing frame and the roller by the roller, the electrostatic test probe, at least one of the X-axis, Y-axis and Z-axis lead screws. With such a structural arrangement, the movement of the components such as the fixing frame and the roller in the electrostatic test device can be made to have better accuracy, consistency, and efficiency. In addition, quantitative verification of electrostatic withstand capability of the electrostatic protective film on the display module can be realized, thereby avoiding uncertainty and inefficiency of manual operation.

Hereinafter, a structure of an electrostatic test device for a display module according to an embodiment of the present disclosure will be described in detail with reference to the accompanying drawings.

Figure 1:
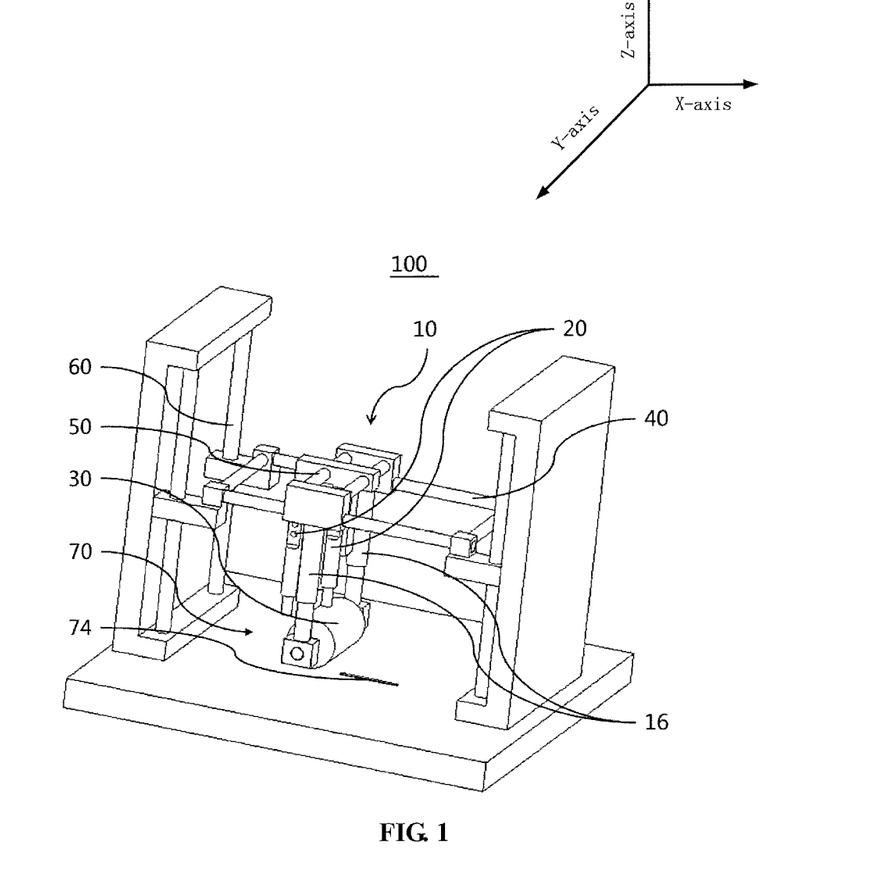
FIG. 1 is a schematic structural view of an electrostatic test device for a display module according to an embodiment of the present disclosure.

Referring to FIG. 1, an electrostatic test device 100 for a display module according to an embodiment of the present disclosure is shown. The electrostatic test device 100 includes a fixing frame 10, an electrostatic test probe 20, a roller 30, and an X-axis lead screw 40. The electrostatic test probe 20 is disposed on the fixing frame 10. In order to strip off the protective film on the display module, the roller 30 is disposed at a lower end of the fixing frame 10.

That is, the display module 200 with the protective film 210 (referring to FIG. 6, which will be described later) is placed below the roller 30 so that the protective film can be stripped off from the display module by the rolling of the roller 30.

In operation, the roller 30 can be moved from left to right in FIG. 1 by the X-axis lead screw 40, so that the protective film is stripped off from the display module, and during the process of stripping off the film, quantity of static electricity on a surface of the protective film 201 and/or a surface of the display module 200 without the protective film 210 may be tested by the electrostatic test probe 20.

It should be noted that, the embodiment of the present disclosure is described by taking the fact that the roller for film-stripping treatment and the electrostatic test probe are simultaneously provided as an example. However, it can be understood that, in a specific case, only one of them can be provided. For example, in the case where only the electrostatic test probe is provided, electrostatic test can be automatically performed by using the electrostatic test probe according to the embodiment of the present disclosure after manually stripping off the protective film from the display module. Alternatively, in the case where only the roller for the film-stripping treatment is provided, the protective film can be automatically stripped off by the movement of the roller on the surface of the display module with the protective film, thereby eliminating cumbersome manual operation, and then the electrostatic test may be performed by an operator holding the electrostatic test probe.

That is to say, although it is described that the automatic film-stripping treatment and the electrostatic test are simultaneously realized by the provided electrostatic test device in the embodiment of the present disclosure, it can be broadly understood that the electrostatic test device according to the present disclosure may also be similar to a device that can automatically strip off the protective film from the display module, or a device that can perform an electrostatic test. It can be selected by those skilled in the art to simultaneously perform the automatic film-stripping treatment and the electrostatic test or only perform one of them as needed. In view of the fact that it is only required to omit functional components related thereto, their variants will not be described in detail in the embodiment of the present disclosure.

Further, in order to realize automatic movement of the fixing frame 10 well, in an embodiment of the present disclosure, a Y-axis lead screw 50 and a Z-axis lead screw 60 are also provided.

In the case where the X-axis lead screw 40 is provided, the roller 30 may be moved in the X-axis direction along the X-axis lead screw 40, and the moving speed is adjustable so that the film-stripping speed can be precisely controlled. In addition, the X-axis lead screw 40 is also used to accurately determine the moving position of the roller 30 during the movement of the roller 30 to the initial position of the film-stripping treatment, that is to say, the moving distance of the X-axis lead screw 40 may be calculated by a control device, to accurately determine the moving position of the roller 30.

In the case where the Y-axis lead screw 50 is provided, the electrostatic test probe 20 disposed on the fixing frame 10 is moved in the Y-axis direction by the drive of the Y-axis lead screw, while the roller 30 can be moved in the X-axis direction. That is, the electrostatic test probe 20 may reciprocate in the Y-axis direction during the film-stripping process. In this way, it ensures that the film-stripping speed and the test distance are accurate and reliable, and an adjustable measurement can be achieved. It should be noted that the reciprocating motion herein is not necessary, and it may also be provided with other forms of test motion routes.

In the case where the Z-axis lead screw 60 is provided, it is possible to adjust a height of the electrostatic test device 100, in particular, height of the electrostatic test probe 20 and the roller 30 in the Z-axis direction. In this way, the height of the roller 30 may be adjusted according to different models of products (or different thicknesses of the display modules).

Obviously, it is not necessary to provide the Y-axis lead screw and/or the Z-axis lead screw, and those skilled in the art can make a selection as needed.

In an example, an electrostatic test device 100 including two X-axis lead screws 40, two Y-axis lead screws 50, and four Z-axis lead screws 60 is shown. It should be understood that the present disclosure is not limited to the arrangement of and the number of the X-axis lead screws, the Y-axis lead screws, and the Z-axis lead screws shown in the drawings, but they are merely are intended to illustrate the inventive concept of the present disclosure. The X-axis lead screw, the Y-axis lead screw, and the Z-axis lead screw in the present disclosure may be set to be the same type of lead screws, for example, a ball screw, or may be different.

In the embodiments of the present disclosure, since the electrostatic test probe 20 and the roller 30 are simultaneously provided, the fixing frame 10 includes a probe holder 11 and a roller holder 16.

Figure 2:
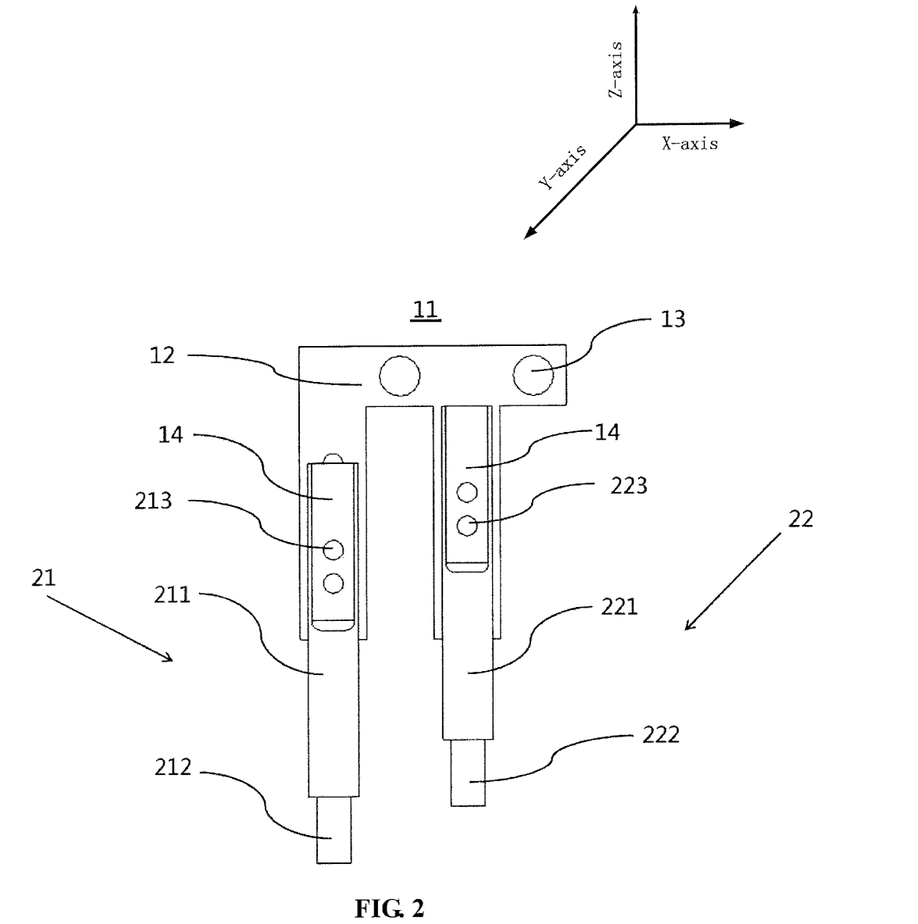
FIG. 2 is a front view of a probe holder in the electrostatic test device shown in FIG. 1.

FIG. 2 is a schematic structural view of a probe holder 11 used in the electrostatic test device shown in FIG. 1 according to an embodiment of the present disclosure. In order to simultaneously test the static electricity of the surface of the display module and the static electricity of the surface of the protective film, the electrostatic test probe 20 includes a first electrostatic test probe 21 and a second electrostatic test probe 22. The first electrostatic test probe 21 is configured to test the static electricity of the surface of the display module after the protective film is stripped off, and the second electrostatic test probe 22 is configured to test the static electricity of the surface of the protective film during the process of stripping off the protective film. Herein, the example in which two probes are included is only for illustrative purpose, and is not intended to limit the scope of the present disclosure. The person skilled in the art can select the number of the first electrostatic test probes or the second electrostatic test probes as needed, or select more other electrostatic test probes. In one embodiment, the number of the first electrostatic test probes and the number of the second electrostatic test probes are each at least one, for example, one first electrostatic test probe and one second electrostatic test probe shown in the drawings.

The first electrostatic test probe 21 and the second electrostatic test probe 22 may be set to be the same or different from each other. In one example of the present disclosure, the first electrostatic test probe 21 and the second electrostatic test probe 22 are set in the same form, that is, the first electrostatic test probe 21 has a body 211 and a protrusion 212 protruding from the body 211, and a detector is provided on the protrusion 212; similarly, the second electrostatic test probe 22 has a body 221 and a protrusion 222 protruding from the body 221, and a detector is provided on the protrusion 222. It should be noted that it is unnecessary to set the first electrostatic test probe 21 and the second electrostatic test probe 22 in the form shown in FIG. 2, and any suitable electrostatic test probes known in the art may be employed.

In the example shown in FIG. 2, since the height of the display module surface with the protective film having been removed is lower than the height of the protective film which is not removed, the distance between the first electrostatic test probe 21 and the surface of the display module is set to be less than the distance between the second electrostatic test probe 22 and the surface of the display module. It is obvious that those skilled in the art can select other suitable setting manners as needed, and it is not limited to the illustrated case.

The probe holder 11 includes a main frame 12, Y-axis through holes 13, and adjustment grooves 14. As shown, the main frame 12 may be of a substantially rectangular parallelepiped, although it can be provided in other forms. The Y-axis through holes 13 are provided in the main frame 12 and they allow the Y-axis lead screws to pass therethrough. In one example, two adjustment grooves 14 are provided to carry the first electrostatic test probe 21 and the second electrostatic test probe 22 described above, respectively. In order to simultaneously test the static electricity of the surface of the display module with the protective film having been stripped off and the static electricity of the surface of the protective film, the two adjustment grooves 14 are arranged to be separated from each other in the X-axis direction, so that the distance between the second electrostatic test probe 22 and a central axis of the roller 30 is greater than the distance between the first electrostatic test probe 21 and the central axis of the roller 30 when the moving direction of the roller 30 is from left to right as shown in FIG. 2. In the illustrated case, a portion of the bodies of the first electrostatic test probe 21 and the second electrostatic test probe 22 may slide in the respective adjustment grooves 14, and they may be fixed after sliding to preset positions. That is, the heights of the first electrostatic test probe 21 and the second electrostatic test probe 22 relative to the display module may be adjusted by adjusting the positions of the bodies of the first electrostatic test probe 21 and the second electrostatic test probe 22 on the adjustment grooves 14. In one example, the bodies 211, 221 of the first electrostatic test probe 21 and the second electrostatic test probe 22 are fixedly connected to the adjustment grooves 14 by bolts 213, 223, and the bolts 213, 223 are respectively disposed at the ends opposite to the protrusions 212, 222. The height adjustment of the electrostatic test probe 20 is achieved by the sliding of the bolts 213, 223 within the adjustment grooves 14 and the fixing of the bolts 213, 223 at different positions within the adjustment groove 14, and the electrostatic test probe 20 and the probe holder 11 are fixed to each other by the bolts 213, 223 at desired heights. Herein, the adjustable arrangement of the electrostatic test probe 20 and the adjustment grooves 14 is not limited to the illustrated case, and those skilled in the art can make a selection as needed.

Figure 3:
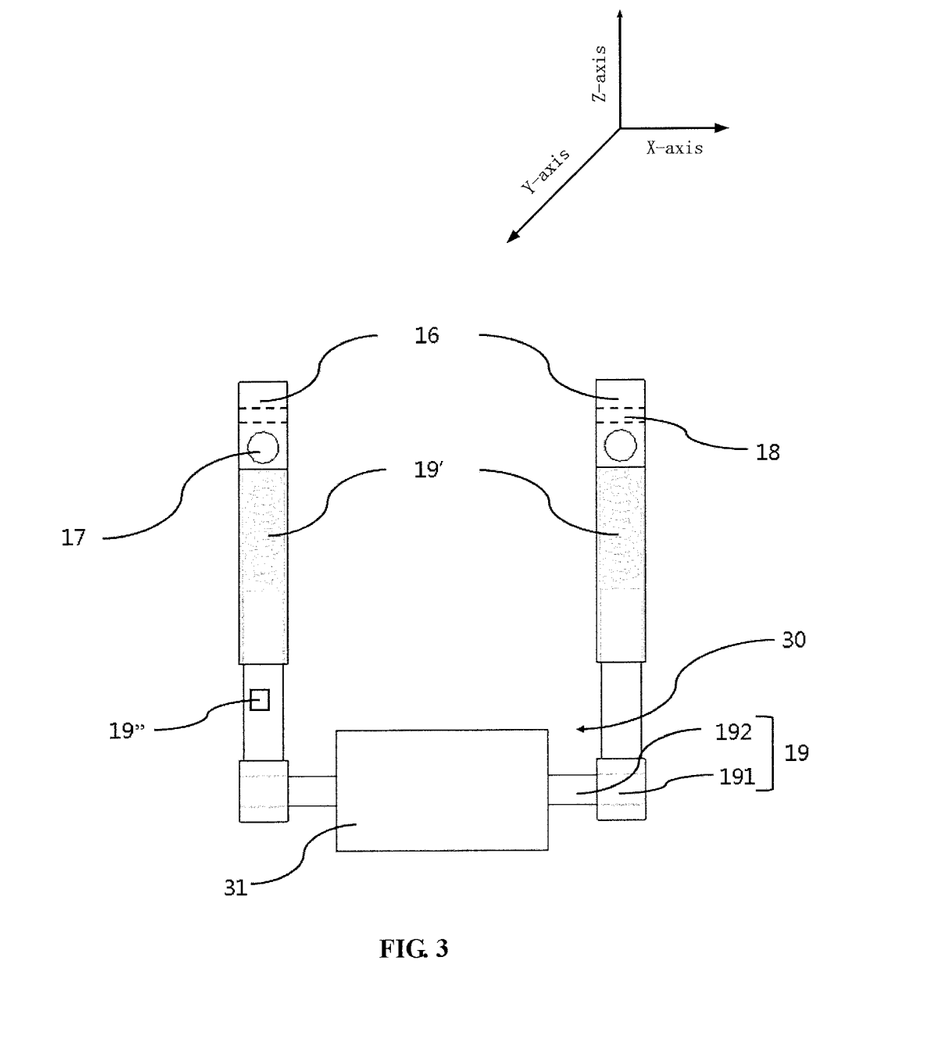
FIG. 3 is a front view of roller holders in the electrostatic test device shown in FIG. 1.

FIG. 3 is a schematic structural view of roller holders 16 used in the electrostatic test device shown in FIG. 1 according to an embodiment of the present disclosure. As can be seen from FIG. 1, in this embodiment, in order to enable the roller 30 to roll on the surface of the display module, two roller holders 16 are provided. The two roller holders 16 are each provided with an X-axis through hole 17 for cooperating with the X-axis lead screw 40 and Y-axis through holes 18 for cooperating with the Y-axis lead screws 50 at upper ends of the two roller holders 16. That is, an X-axis through hole 17 allowing one X-axis lead screw 40 to pass therethrough is provided in the X-axis direction of the roller holder 16, and two Y-axis through holes 18 allowing two Y-axis lead screws 50 to pass therethrough are provided in the Y-axis direction of the roller holder 16.

Pivoting members 19 are provided at lower ends of the two roller holders 16 and configured to pivotally connect the roller 30, so that the roller 30 can roll while moving on the display module. In one example, the pivoting member 19 may include a pivoting seat 191 and a pivoting shaft 192, and the pivoting shaft 192 passes through the center of the roller 30 and is fixedly connected to the roller 30, while the pivoting seat 191 is pivotally connected to the pivoting shaft 192.

In order to retract the roller 30 in the Z-axis direction, a compression spring 19' is also provided in each of the roller holders 16. Thus, when the Z-axis lead screw adjusts the height of the roller 30, the roller 30 is placed at a position lower than the position of the protective film on the surface of the display module to which the roller 30 will contact by the movement of the Z-axis lead screw. At this time, the roller 30 applies a predetermined force to the protective film on the surface of the display module. Such an applied force will allow the surface of the roller 30 to be in firm contact with the surface of the protective film by electrostatic force, thereby facilitating the film-stripping treatment. In such a case, the compression spring 19' will be properly retracted within the roller holder 16, to automatically adjust degree of contact with the protective film on the surface of the display module.

In practice, in order to facilitate the film-stripping treatment, an antistatic material may be provided on the surface of the roller 30 to prevent generation of static electricity during the film-stripping process and thereby interference with the measurement. Further, a viscous material may be provided on the surface of the roller 30 to bond the protective film to facilitate the film-stripping treatment. Of course, in one example, it is also possible to provide a coating 31 having both the antistatic material and the viscous material. The coating 31 may be provided on the surface of the roller 30. The person skilled in the art can select a suitable antistatic material and a suitable viscous material as needed, so the details of these materials will be omitted in the present disclosure.

In one example, a charge coupling device (CCD) 19" is provided on a body of the roller holder 16 or the probe holder 11 for detecting the position of the display module and positioning the display module, and the details will be described in detail in the section regarding a base shown in FIG. 5 below. FIG. 3 only shows the case where the CCD 19" is provided on the roller holder 16. The CCD 19" may be disposed at any suitable positions of the fixing frame 10, which will not be limited in the present disclosure.

Figure 4:
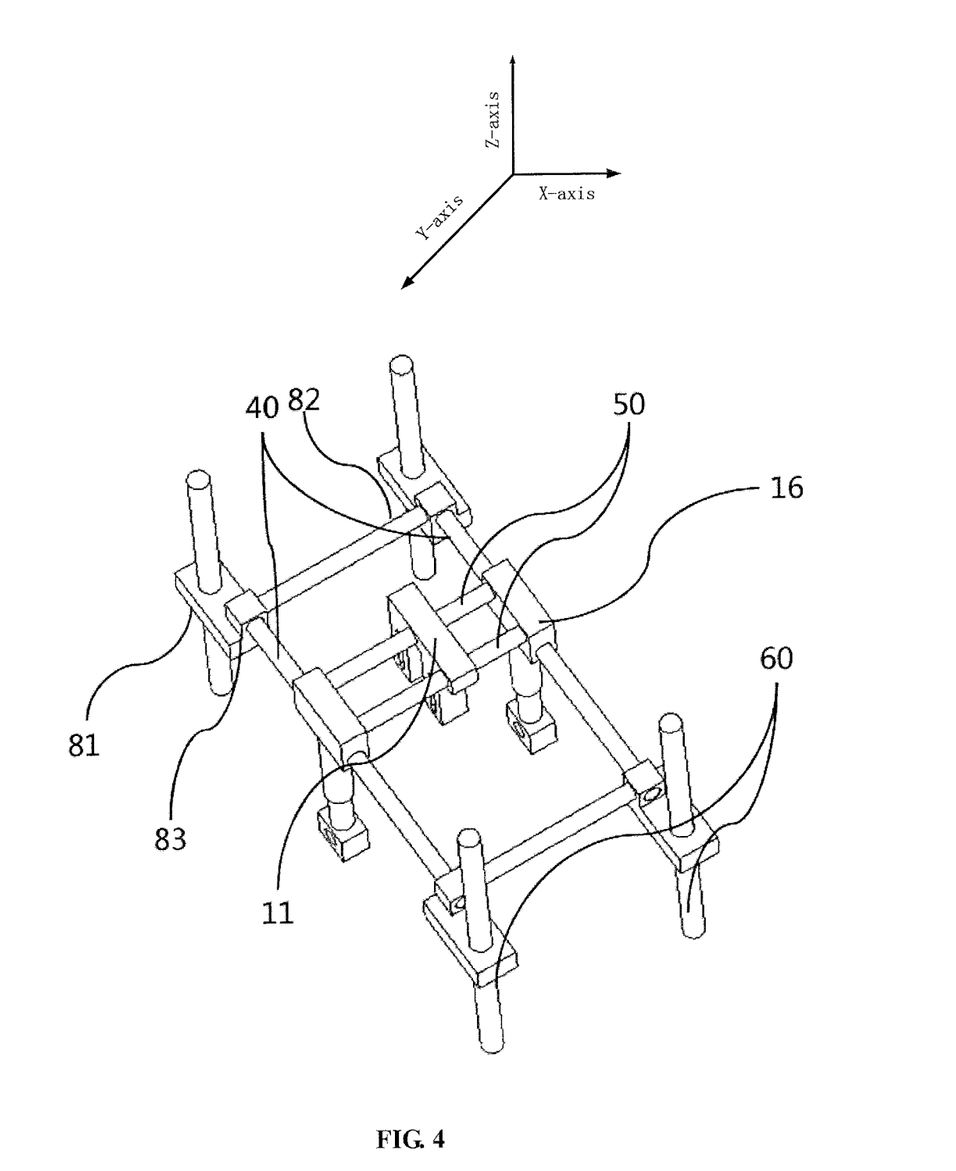
FIG. 4 is a schematic structural view of a movement control mechanism in the electrostatic test device shown in FIG. 1.

FIG. 4 is a schematic structural view of a movement control mechanism in the electrostatic test device shown in FIG. 1. In the illustrated case where two X-axis lead screws 40, two Y-axis lead screws 50 and four Z-axis lead screws 60 are provided, the two X-axis lead screws 40 pass through the X-axis through holes 17 in the two roller holders 16, respectively, and each X-axis lead screw 40 is connected to the Z-axis lead screws 60 via support members 81 at two opposite ends of each X-axis lead screw; the two Y-axis lead screws 50 both pass through the Y-axis through holes 18, 13 in the roller holders 16 and the probe holder 11 and are directly connected to the roller holders 16 and the probe holder 11.

In order to fixedly connect the X-axis lead screws 40 and the Y-axis lead screws 50, a connecting rod 82 and connecting members 83 are also provided at one end of the two X-axis lead screws 40. The connecting member 83 may be fixedly connected to a corresponding support member 81 by fixed connections, such as bolts, screws, soldering or any other suitable manners.

In operation, the movement of each of the lead screws 40, 50, and 60 may be controlled by a controller such as a PLC (Programmable Logic Controller), and the height of the roller 30 may be adjusted by the Z-axis lead screws 60 according to the thickness of the display module, so as to smooth the film-stripping treatment. The movement speed (that is, the film-stripping speed) of the roller 30 may be precisely controlled by the X-axis lead screws 40, so that the film-stripping speed of the entire film-stripping process can be accurately controlled. The Y-axis lead screws 50 may control the two electrostatic test probes 21 and 22 to reciprocate, so as to achieve electrostatic measurements of the surface of the display module with the film being stripped off and the surface of the protective film.

Figure 5:
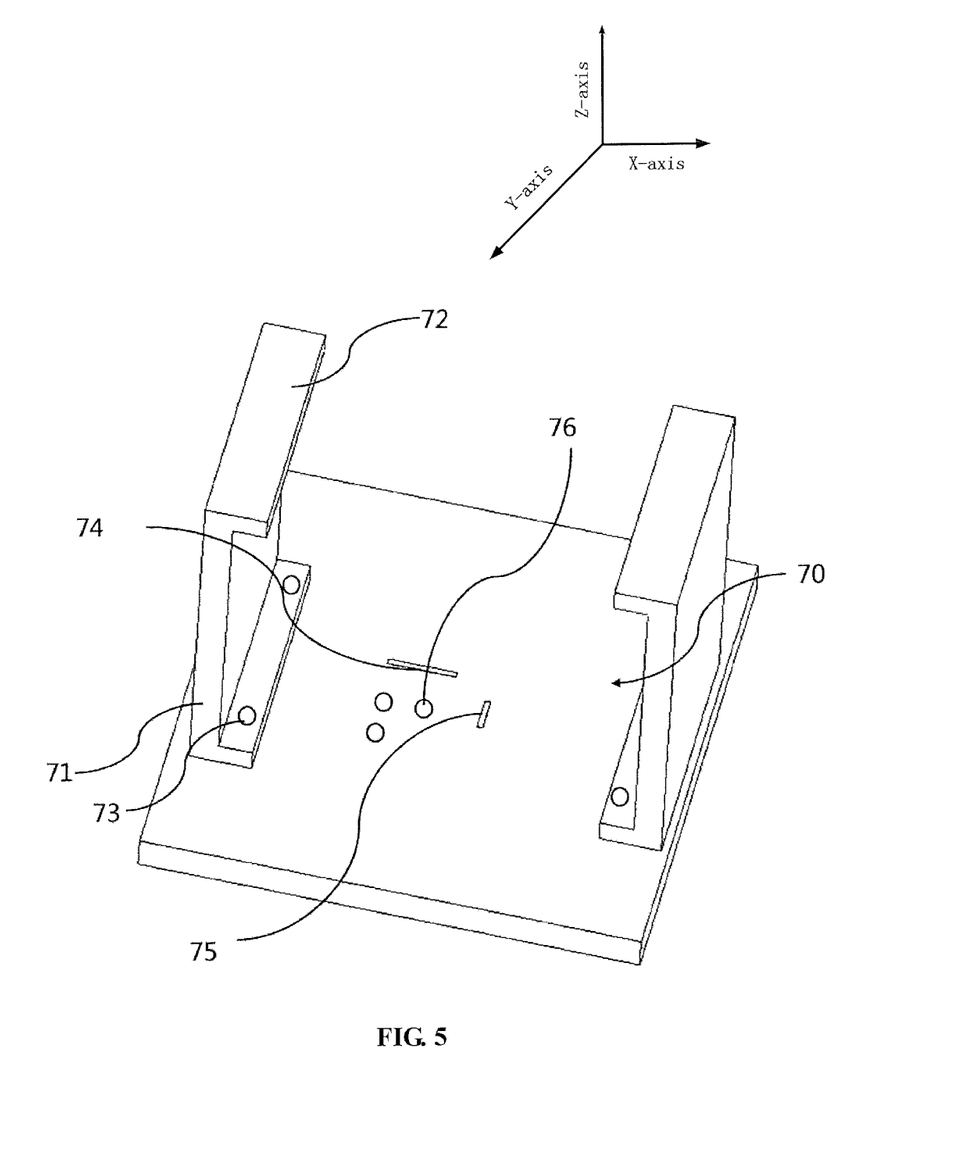
FIG. 5 is a schematic structural view of a base in the electrostatic test device shown in FIG. 1.

FIG. 5 is a schematic structural view of a base in the electrostatic test device shown in FIG. 1. In an embodiment of the present disclosure, the electrostatic test device 100 further includes a base 70. The base 70 is provided with at least two vertical support plates 71. Two support plates are taken as an example for description of this embodiment, but it is to be understood by those skilled in the art that other numbers of support plates can also be provided. Specifically, each of the support plates 71 is set to be fixedly connected to at least one of the Z-axis lead screws 60. In one embodiment of the present disclosure, each of the support plates 71 is fixedly connected to two Z-axis lead screws 60 since four Z-axis lead screws 60 are provided. In one example, each of the support plates 71 is configured to have inwardly protruding horizontal support portions 72 at upper and lower ends thereof, and each of the horizontal support portions 72 is provided with two support holes 73 for respectively accommodating the ends of the respective Z-axis lead screws 60. In addition, it should be noted that it is also possible to provide motors for driving the X-axis lead screws 40, the Y-axis lead screws 50, and the Z-axis lead screws 60 at suitable positions of the fixing frame 10, for example, at a position where one of the connecting members 83 is located. Of course, the present disclosure is not limited thereto.

In addition, an X-axis positioning block 74 and a Y-axis positioning block 75 for positioning the display module are further provided on the base 70. The positioning of the display module may be achieved by the X-axis positioning block 74 and the Y-axis positioning block 75. After positioning, the display module is also fixed on the base 70 by air suction holes 76 provided in the base 70. An adsorption force generated by the air suction holes 76 fix the display module on the base in position. In one example, the air suction holes 76 are connected to an air extraction device (air pump) to achieve a corresponding suction and exhaust function. In an alternative embodiment, the air suction holes 76 may also be provided in the form of vacuum suction holes.

In one example, the positions of the X-axis positioning block 74 and the Y-axis positioning block 75 may be detected by the CCD 19″, to achieve the alignment of the roller 30. Therefore, the CCD 19″ may be provided on the roller holder 16, or on the probe holder 11, as long as position test function and positioning function can be realized.

Figure 6:
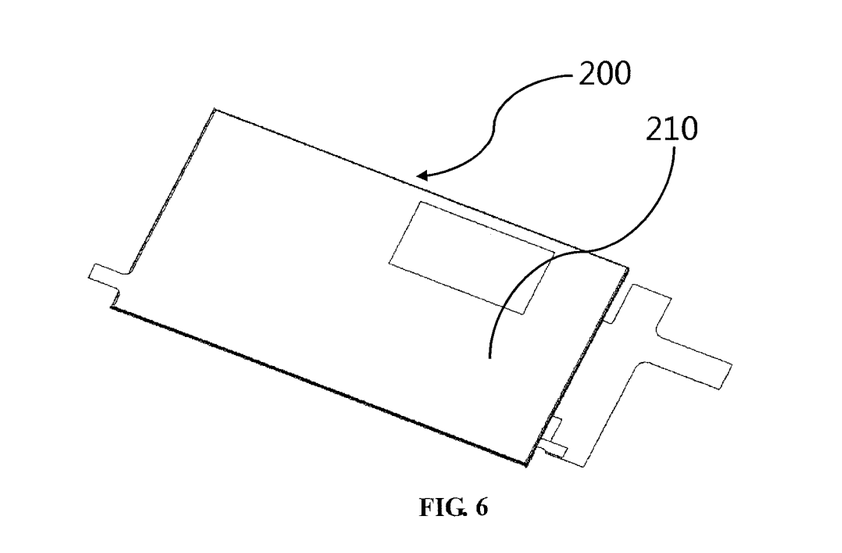
FIG. 6 is a schematic structural view of a display module with a protective film according to an embodiment of the present disclosure.
Figure 7:
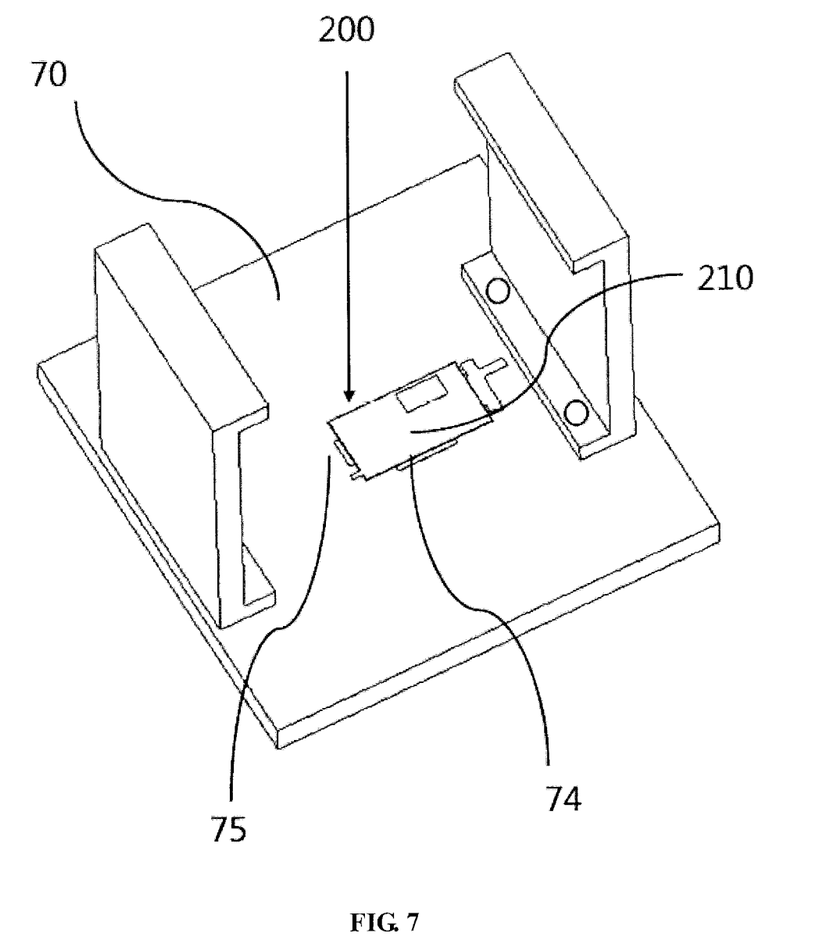
FIG. 7 is a structural schematic view showing that the display module with the protective film shown in FIG. 6 is placed on the base shown in FIG. 5.

FIG. 6 is a schematic structural view of a display module with a protective film that is not mounted on a base of an electrostatic test device according to an embodiment of the present disclosure, and FIG. 7 is a schematic structural view of a display module with a protective film that is mounted on a base of an electrostatic test device according to an embodiment of the present disclosure. In the example, it is shown that the protective film 210 is disposed on a back surface of the display module 200, and when the static electricity is measured, the display module 200 is disposed on the base 70 shown in FIG. 5 with the back surface thereof facing upwards, and two side edges of the display module are positioned by the X-axis positioning block 74 and the Y-axis positioning block 75, respectively. It should be understood that the protective film may also be disposed on a front surface of the display module 200 and a similar electrostatic test may be performed, which will not be described in detail herein.

In a particular operational application of the electrostatic test device according to the present disclosure, the entire electrostatic test device 100 is controlled by the PLC. Initially, the display module is positioned on the base 70 by the X-axis positioning block 74 and the Y-axis positioning block 75, and the alignment of the display module and the roller 30 is achieved by the CCD 19″. The electrostatic test device 100 is moved to the initial position of the film-stripping treatment by the X-axis lead screws 40 and the Z-axis lead screws 60, the heights of the first electrostatic test probe 21 and the second electrostatic test probe 22 are fine-tuned, and the moving speed of the roller is adjusted by the X-axis lead screws 40. When the electrostatic test device 100 starts to work, the first electrostatic test probe 21 and the second electrostatic test probe 22 reciprocate along the Y-axis direction while the roller 30 moves along the X-axis direction. When the electrostatic test device 100 reaches the end position of the film-stripping treatment, the test process will end. Therefore, during the electrostatic test process, the film-stripping speed and the test distance are precisely controlled, and the adjustable measurement is achieved.

The above-described embodiments are merely illustrative of the principle and construction of the present disclosure, but they are not intended to limit the present disclosure. It should be understood by those skilled in the art that any changes and improvements to the present disclosure may be made without departing from the general inventive concept of the present disclosure, and such changes and improvements should fall within the scope of the present disclosure. The scope of the present disclosure should be defined by the claims of the present disclosure.

What is claimed is:

1. An electrostatic test device for a display module, comprising:
 a fixing frame;
 an electrostatic test probe on the fixing frame;
 a film-stripping mechanism on the fixing frame, the film-stripping mechanism being configured to strip off a protective film on the display module; and
 a drive assembly configured to drive the electrostatic test probe and/or the film-stripping mechanism to move, wherein the drive assembly comprises: a first driver configured to drive the fixing frame to move in a first direction; and a second driver configured to drive the fixing frame to move in a second direction perpendicular to the first direction, wherein the first driver comprises at least one first lead screw, and the second driver wherein the electrostatic test probe comprises: a first electrostatic test probe configured to test static electricity of a surface of the display module; and a second electrostatic test probe configured to test static electricity of a surface of the protective film.

2. The electrostatic test device according to claim 1, wherein the fixing frame comprises a probe holder, and the probe holder comprises a main frame, a through hole allowing the second lead screw to pass therethrough, and at least one adjustment groove extending downward from the main frame of the probe holder.

3. The electrostatic test device according to claim 2, wherein the probe holder comprises at least two adjustment grooves separated from each other in the first direction, the first electrostatic test probe and the second electrostatic test probe each are disposed in one adjustment groove in an adjustable manner, and the second electrostatic test probe is disposed in front of the first electrostatic test probe in a moving direction of the film-stripping mechanism.

4. The electrostatic test device according to claim 1, wherein the film-stripping mechanism comprises a roller disposed at a lower end of the fixing frame.

5. The electrostatic test device according to claim 4, wherein the fixing frame comprises two roller holders, each of which is provided with through holes cooperating with the first lead screw and the second lead screw, and wherein the two roller holders are also provided with pivoting members pivotally connecting the roller.

6. The electrostatic test device according to claim 5, wherein a compression spring is provided in each of the roller holders so that the roller is extendable towards the fixing frame or retractable away from the fixing frame.

7. The electrostatic test device according to claim 4, wherein the drive assembly further comprises a third driver configured to drive the fixing frame to move in a third direction perpendicular to the first direction and the second direction, and the third driver comprises at least one third lead screw.

8. The electrostatic test device according to claim 7, wherein the electrostatic test device comprises two first lead screws, two second lead screws, and four third lead screws.

9. The electrostatic test device according to claim 8, wherein the fixing frame comprises a probe holder, and the probe holder comprises a main frame, through holes allowing the second lead screws to pass therethrough, and at least one adjustment groove extending downward from the main frame of the probe holder;

the fixing frame comprises two roller holders, each of which is provided with through holes cooperating with the first lead screws and the second lead screws respectively;

the two first lead screws are configured to respectively pass through the through holes in the roller holder and respectively connected to each of the third lead screws at two ends of the first lead screws via support members; and the two second lead screws are configured to pass through the through holes of the roller holders and the probe holder respectively.

10. The electrostatic test device according to claim 8, further comprising a base on which at least two support plates extending in the third direction are provided, each of the support plates being fixedly connected to at least one of the third lead screws.

11. The electrostatic test device according to claim 10, wherein a first directional positioning block and a second directional positioning block configured to position the display module are provided on the base.

12. The electrostatic test device according to claim 11, further comprising a charge coupling device disposed on the fixing frame, the charge coupling device being configured to move the film-stripping mechanism to an initial film-stripping position according to the first directional positioning block and the second directional positioning block.

13. The electrostatic test device according to claim 10, wherein the base is provided with an air suction hole, and an adsorption force generated by the air suction hole fixes the display module on the base in position.

14. The electrostatic test device according to claim 4, wherein a surface of the roller is provided with an antistatic material.

15. The electrostatic test device according to claim 14, wherein a surface of the roller is provided with a viscous material.

* * * * *